United States Patent [19]
Nozaki et al.

[11] Patent Number: 5,744,828
[45] Date of Patent: Apr. 28, 1998

[54] SEMICONDUCTOR LIGHT EMITTING DEVICE WITH BLOCKING LAYER

[75] Inventors: Hideki Nozaki, Kawasaki; Kazumi Unno, Yokohama; Yasuo Idei, Tama; Katsuhiko Nishitani, Kawasaki, all of Japan

[73] Assignee: Kabushiki Kaisha Toshiba, Kanagawa-ken, Japan

[21] Appl. No.: 678,626

[22] Filed: Jul. 10, 1996

[30] Foreign Application Priority Data

Jul. 13, 1995 [JP] Japan .................. 7-199324

[51] Int. Cl.$^6$ .................................................. H01L 33/00
[52] U.S. Cl. ........................... 257/94; 257/95; 257/96; 257/97; 257/98; 372/46; 372/49; 372/99
[58] Field of Search .............................. 257/98, 94, 95, 257/96, 97, 99; 372/49, 46, 99

[56] References Cited

U.S. PATENT DOCUMENTS

| | | | |
|---|---|---|---|
| 4,145,707 | 3/1979 | Sadamasa et al. | 257/99 X |
| 5,309,001 | 5/1994 | Watanabe et al. | 257/99 |
| 5,466,950 | 11/1995 | Sugawara et al. | 257/96 X |
| 5,506,423 | 4/1996 | Saeki | 257/96 X |
| 5,517,039 | 5/1996 | Holonyak, Jr. et al. | 257/95 X |
| 5,585,649 | 12/1996 | Ishikawa et al. | 257/95 X |

*Primary Examiner*—William Mintel
*Attorney, Agent, or Firm*—Finnegan, Henderson, Farabow, Garrett & Dunner, L.L.P.

[57] ABSTRACT

A semiconductor light emitting device has a semiconductor substrate (1). On a first principal plane of the substrate, an emission layer is formed. In a predetermined region on the emission layer, a current blocking layer (10) is formed. On the current blocking layer, an excitation electrode (20) is formed. A substrate electrode (9) is formed on a second principal plane of the substrate. The excitation electrode is composed of a bonding pad (21) and a current supply electrode (22). The current blocking layer is under the bonding pad. The current blocking layer prevents a current from flowing under the bonding pad. The current supply electrode improves the light emission efficiency of the device.

15 Claims, 8 Drawing Sheets

$L_1 \fallingdotseq L_2$ $L_3 \fallingdotseq L_4$

SEMICONDUCTOR LIGHT EMITTING DEVICE WITH BLOCKING LAYER

BACKGROUND OF THE INVENTION

1. Field of the Invention

The present invention relates to a semiconductor light emitting device having high light emitting efficiency, and particularly, to a high-brightness semiconductor light emitting device used for an outdoor or indoor information board, an automobile stop lamp, a signal, etc.

2. Description of the Prior Art

Semiconductor light emitting devices include light emitting diodes (LEDs), laser diodes (LDs), and electroluminescent devices (ELs). The LEDs and LDs apply a forward voltage to a semiconductor junction to inject minority carriers, which recombine with majority carriers at the junction to emit light. The ELs apply an electric field to a crystal to emit light. These devices operate under DC or AC voltage. The LEDs, in particular, high-brightness LEDs are used for indoor/outdoor information boards, road signs, automobile stop lamps, and signals. The LEDs provide bright light with a low current, and therefore, consume small energy. Some types of LEDs will be explained.

Red GaAsP LEDs have a peak wavelength of about 630 nm, and red GaAlAs LEDs have a peak wavelength of about 660 nm. Orange GaAsP LEDs have a peak wavelength of about 610 nm. Yellow GaAsAlP LEDs have a peak wavelength of about 590 nm. Green GaP LEDs have a peak wavelength of about 565 nm. The brightness of a GaAsP LED is about 300 mcd, that of a red single-hetero-structure (SH) GaAlAs LED is about 500 mcd, that of a red double-hetero-structure (DH) GaAlAs LED without a GaAs substrate is about 3000 mcd, and that of a green GaP LED is about 500 mcd.

The semiconductor light emitting devices are formed according to, for example, a vapor phase epitaxial growth (VPE) or a liquid phase epitaxial growth (LPE). The VPE is suitable for forming GaAsP. The LPE is suitable for forming GaAlAs and GaP. There are other techniques such as a metal organic chemical vapor deposition (MOCVD) and a molecular beam epitaxy (MBE).

FIG. 13 shows a yellow InGaAlP LED according to the prior art. A semiconductor substrate 1 is, for example, a GaAs compound semiconductor substrate of about $3\times10^{18}$ cm$^{-3}$ in impurity concentration. On the substrate 1, ten pairs of n-type GaAs and n-type $In_{0.5}Al_{0.5}P$ films are successively grown according to the MOCVD, to form a reflection layer 2. The thickness of each of these films is ¼n of the wavelength of emitted light (n being the refractive index of the film). On the reflection layer 2, an emission layer 40 is formed. The emission layer 40 consists of an n-type $In_{0.5}(Ga_{0.3}Al_{0.7})_{0.5}P$ clad layer 3 of 0.6 μm thick, an n-type $In_{0.5}(Ga_{0.7}Al_{0.3})_{0.5}P$ active layer 4 of 0.3 μm thick, and a p-type $In_{0.5}(Ga_{0.3}Al_{0.7})_{0.5}P$ clad layer 5 of 0.6 μm thick. On the emission layer 40, a p-type $Ga_{0.3}Al_{0.7}As$ current diffusion layer 6 of 7.0 μm thick, and a p-type GaAs contact layer 7 of 0.15 μm thick are successively formed. An Au-Zn positive electrode (excitation electrode) 8 is formed at the center of the contact layer 7. The exposed part of the contact layer 7 except the part covered with the electrode 8 is removed by etching, to expose the current diffusion layer 6. An Au-Ge negative electrode (substrate electrode) 9 is formed over the bottom surface of the substrate 1. Then, the substrate 1 is diced into LED chips. The current diffusion layer 6 diffuses a current from the excitation electrode 8 all over the LED chip as indicated with dotted lines. Continuous arrow marks indicate the paths of emitted light.

Among the materials of semiconductor light emitting devices, InGaAlP has large resistivity. This is the reason why the current diffusion layer 6 is formed to diffuse a current. The diffusion of a current of the prior art, however, is insufficient. An area 41 in the active layer 4 just under the excitation electrode 8 also emits light, and the ratio of the light emission of this area to the total light emission is large. Namely, the excitation electrode 8 absorbs a large part of emitted light to deteriorate the light emission efficiency of the device.

SUMMARY OF THE INVENTION

An object of the present invention is to provide a semiconductor light emitting device capable of widely diffusing a current that is usually collected under an excitation electrode (8), improving light emitting efficiency, and realizing high brightness.

In order to accomplish the object, the present invention provides a semiconductor light emitting device having a current blocking layer formed under a bonding pad of an excitation electrode. The excitation electrode has, in addition to the bonding pad, a current supply electrode evenly formed on an emission plane. This device is composed of a semiconductor substrate, an emission layer composed of a plurality of semiconductor films formed on a first principal plane of the semiconductor substrate, the current blocking layer formed in a predetermined region on the emission layer, the excitation electrode formed on the emission layer and current blocking layer, and a substrate electrode formed on a second principal plane of the semiconductor substrate. The excitation electrode has the bonding pad connected to a bonding wire for supplying an external current, and the current supply electrode. The current blocking layer is under the bonding pad. A reflection layer may be formed between the first principal plane and the emission layer. A current diffusion layer may be formed on the emission layer. A contact layer may be formed between the emission layer or current diffusion layer and the excitation electrode and current blocking layer. The top surface of the device except the bonding pad provides the emission plane, and the ratio of the area of the current supply electrode to the area of the emission plane must be equal to or less than 25%. The current blocking layer may be formed in one area above the first principal plane, and the emission plane in another area above the first principal plane. The thickness of the current blocking layer may be equal to or larger than 0.1 μm.

The current blocking layer prevents a current from flowing under the bonding pad, and the current supply electrode improves the light emitting efficiency of the device.

The current supply electrode may be quadrangle frames formed around the bonding pad and electrically connected to the bonding pad.

The current supply electrode may be a quadrangle frame.

The current supply electrode may be a quadrangle frame formed along the periphery of the contact layer.

The current blocking layer may be formed substantially entirely except under the current supply electrode.

The current supply electrode may be a T-shaped frame.

The current supply electrode may be a cross-shaped frame.

The semiconductor substrate may be a GaAs compound semiconductor substrate, and the emission layer may be made of 4-element compound semiconductor containing In, Ga, Al, and P.

DETAILED DESCRIPTION OF THE EMBODIMENTS

A semiconductor light emitting device according to the first embodiment of the present invention will be explained with reference to FIGS. 1 to 4.

Figure 1:
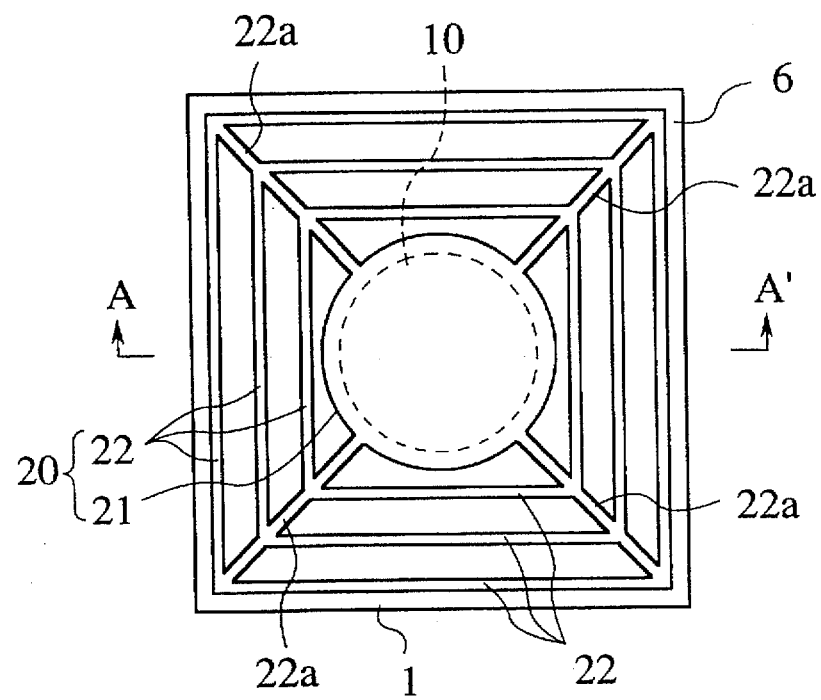
FIG. 1 is a plan view showing a semiconductor light emitting device according to a first embodiment of the present invention.
Figure 2:
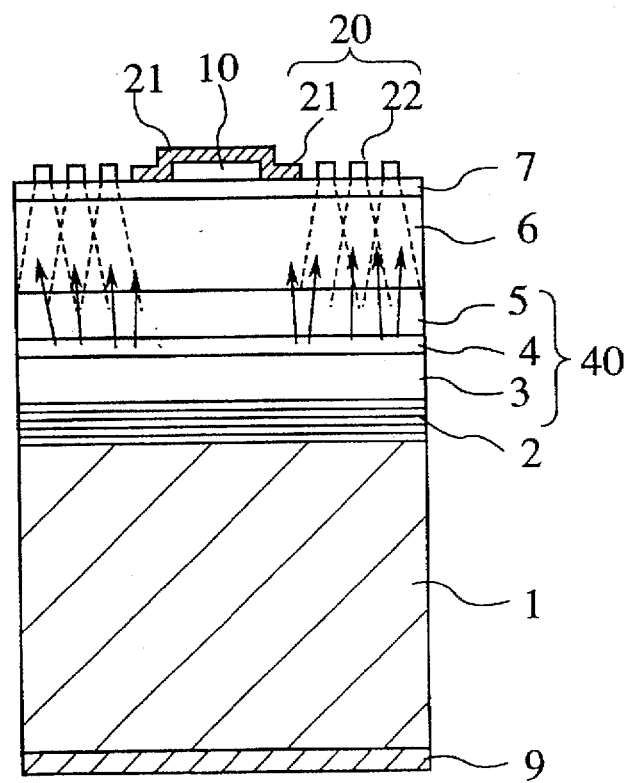
FIG. 2 is a sectional view taken along a line A—A' of FIG. 1.
Figure 3:
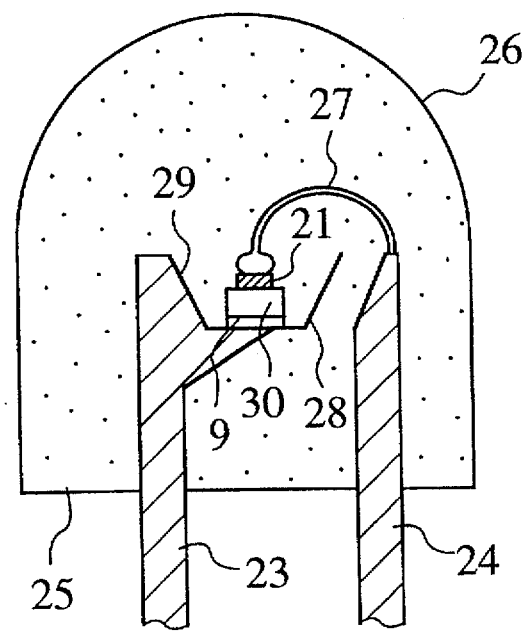
FIG. 3 is a sectional view showing a packaged containing the device of FIG. 2.

FIG. 1 is a plan view of the device, FIG. 2 is a sectional view taken along a line A—A' of FIG. 1, and FIG. 3 is a sectional view of a package containing the device. This device is an InGaAlP LED. The LED consists of a semiconductor substrate 1, which is, for example, a GaAs compound semiconductor substrate of $3\times10^{18}$ cm$^{-3}$ in impurity concentration. The LED is diced from a wafer. On a first principal plane of the substrate 1, a reflection layer 2 is formed. The reflection layer 2 consists of 10 pairs of n-type GaAs and n-type In$_{0.5}$Al$_{0.5}$P films. On the reflection layer 2, an emission layer 40 is formed. The emission layer 40 consists of a clad layer 3, an active layer 4, and a clad layer 5. On the emission layer 40, a current diffusion layer 6 is formed. On the current diffusion layer 6, a contact layer 7 is formed. On the contact layer 7, a current blocking layer 10 characteristic to the present invention is selectively formed. An excitation electrode (positive electrode) 20 is formed on the current blocking layer 10. The excitation electrode 20 consists of a bonding pad 21 and a current supply electrode 22. In FIG. 2, dotted lines indicate current flows, and continuous lines indicate paths of emitted light.

The bonding pad 21 is on the current blocking layer 10, and the current supply electrode 22 is on the contact layer 7. On a second principal plane of the substrate 1, a substrate electrode (negative electrode) 9 is formed to provide ohmic contact.

The bonding pad 21 is at the center of the current diffusion layer 6 with the current blocking layer 10 and contact layer 7 interposing between them. The current supply electrode 22 is evenly formed on the contact layer 7 except the part where the bonding pad 21 is formed, to uniformly emit light. There is no current block layer 10 under the current supply electrode 22. Namely, the current supply electrode 22 is directly on the contact layer 7. To sufficiently emit light, the ratio of the area of the current supply electrode 22 to the area of a light emission plane must be equal to or less than 25%. This embodiment evenly distributes the current supply electrode 22 over the light emission plane. According to the first embodiment, the current supply electrode 22 consists of three quadrangle frames made of narrow metal films running along four sides of the substrate 1, and four straight lines 22a made of narrow metal films running along diagonals of the substrate 1.

A method of manufacturing the LED of the first embodiment will be explained. There are various methods such as the MOCVD and MBE to grow semiconductor layers. As an example, the MOCVD will be explained.

The substrate 1 is, for example, a silicon-doped n-type GaAs semiconductor substrate of $3\times10^{16}$ cm$^{-3}$ in impurity concentration having a crystal plane of [100]. The MOCVD forms semiconductor layers on the substrate 1 with trimethylgallium (TMG), trimethylaluminum (TMA), trimethylindium (TMI), AsH$_3$, or PH$_3$. Dopant employed to determine the conduction type of the semiconductor layers is DMZ for p type and SiH$_4$ for n type. A crystal growth temperature is about 700° C., and the pressure of a reaction chamber is about 40 torrs. Ten pairs of n-type GaAs and n-type In$_{0.5}$Al$_{0.5}$P films are successively grown to form the reflection layer 2. The thickness of each film is ¼n of the wavelength of emitted light (n being the refractive index of the film).

On the reflection layer 2, a silicon-doped n-type In$_{0.5}$(Ga$_{0.3}$Al$_{0.7}$)$_{0.5}$P clad layer 3 of 0.6 µm thick and $4\times10^{17}$ cm$^{-3}$ in impurity concentration is formed. On the clad layer 3, a non-doped n-type In$_{0.5}$(Ga$_{1-x}$Al$_x$)$_{0.5}$P active layer 4 of 0.3 µm thick and $10^{16}$ cm$^{-3}$ in impurity concentration is formed with 0<=x<=0.5. On the active layer 4, a Zn-doped p-type In$_{0.5}$(Ga$_{0.3}$Al$_{0.7}$)$_{0.5}$P clad layer 5 of 0.6 µm thick and $4\times10^{17}$ cm$^{-3}$ in impurity concentration is formed. These layers 3, 4, and 5 form the emission layer 40. On the clad layer 5, a p-type Ga$_{1-y}$Al$_y$As current diffusion layer 6 (0<y<1) of 7.0 µm thick is formed. The mixed crystal ratio y of Al of the current diffusion layer 6 is set to be sufficiently transparent with respect to the wavelength of emitted light. Namely, the resistivity of the current diffusion layer 6 is set to be sufficiently low (ideally, zero). On the current diffusion layer 6, a p-type GaAs contact layer 7 of 0.1 µm thick is formed. On the contact layer 7, an n-type In$_{0.5}$(Ga$_{0.3}$Al$_{0.7}$)$_{0.5}$P current blocking layer 10 of 0.3 µm thick is formed. The layers 7 and 10 are successively formed in a single growth process. The current blocking layer 10 is patterned according to a photo engraving process (PEP) and an etching process.

An excitation electrode 20 is formed on the current blocking layer 10 and contact layer 7. The excitation electrode 20 consists of AuZn, Mo, and Au films of 0.2, 0.15, and 0.8 µm thick, respectively. The excitation electrode 20 is patterned according to the PEP and etching processes into the bonding pad 21 and current supply electrode 22. On a second principal plane of the substrate 1, an AuGe-based substrate electrode (negative electrode) 9 is deposited to a thickness of about 0.5 µm. A sintering process is carried out to improve the strength of ohmic contact between the current supply electrode 22 and the contact layer 7, ohmic contact between the substrate electrode 9 and the substrate 1, and adhesion between the bonding pad 21 and the current blocking layer 10. The sintering process is carried out at 450° C. for 10 minutes so that the substrate electrode 9 and excitation electrode 20 may have ohmic characteristics, metal may not completely diffuse to the current block layer 10, and adhesion may be sufficient.

The contact layer 7 except under the excitation electrode 20 is selectively removed by etching. The substrate 1 is diced into separate LED chips.

The current blocking layer 10 prevents a current from flowing under the bonding pad 21, while the current supply electrode 22 formed around the bonding pad 21 lets the device uniformly emit light, to thereby improve the light emission efficiency of the device. In this embodiment, the conduction type of the current blocking layer 10 is opposite to that of the p-type contact layer 7.

Figure 4:
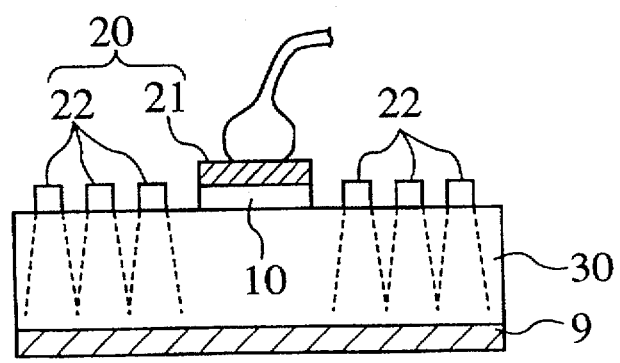
FIG. 4 is an enlarged section showing the device in the package of FIG. 3.

FIG. 3 shows a package containing the LED of FIG. 2, and FIG. 4 is an enlarged section showing the LED in the package.

A lead frame 23 is vertically buried in the package 25. An end of the lead frame 23 has a mounter 28 to which the LED 30 is attached. The substrate electrode 9 of the LED 30 is bonded to the mounter 28. The end of the lead frame 23 is electrically connected to the substrate electrode 9, and the other end thereof is outside the package 25.

The package 25 is made of, for example, transparent epoxy resin and has a lens 26 to spread light. Light emitted by the LED 30 advances orthogonally to the emission plane of the LED 30, passes through the transparent package 25, and goes outside. In the package 25, a lead frame 24 faces the lead frame 23. An end of the lead frame 24 is connected to a bonding wire 27 made of, for example, Au. The other end of the lead frame 24 is outside the package 25. The other end of the bonding wire 27 is bonded to the bonding pad 21 of the excitation electrode 20 of the LED 30. To effectively guide light emitted from the side faces of the LED 30 in an original light emitting direction, a reflector 29 made of, for example, metal is arranged in the package 25, to face the side faces of the LED 30. The reflector 29 is attached to the mounter 28 to reflect light from the side faces of the LED 30 into the original light emitting direction. The reflector 29 is made of the same material as the lead frames, for example, Fe-based alloy plated with Ag.

Figure 5:
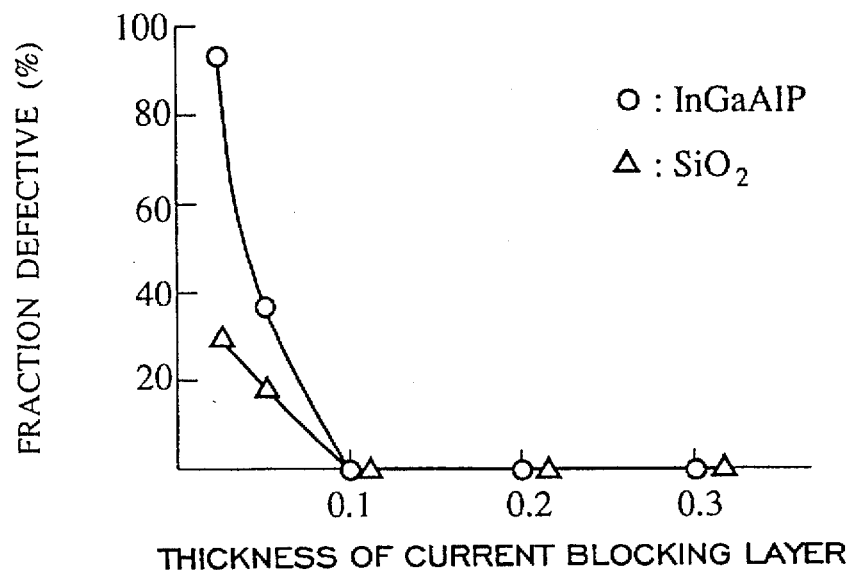
FIG. 5 is a graph showing the current blocking effect of the present invention.

FIG. 5 is a graph showing the relationship between the thickness of the current blocking layer 10 and fraction defective. The effect of the current blocking layer 10 will be explained with reference to this graph. To form ohmic contact between the current supply electrode 22 and the contact layer 7 and between the substrate electrode (negative electrode) 9 and the substrate 1, it is necessary to sinter the substrate 1 for about 10 minutes at 450° C. Under these sintering conditions, current blocking layers made of InGaAlP and SiO$_2$ were tested. When the thickness of any current blocking layer exceeds 0.1 μm, the fraction defective thereof is nearly zeroed. If the thickness is thinner than 0.1 μm, the fraction defective thereof greatly increases. When the thickness of any one of the InGaAlP and SiO$_2$ layers is less than 0.1 μm, the excitation electrode of the device diffuses through the current blocking layer.

Figure 14:
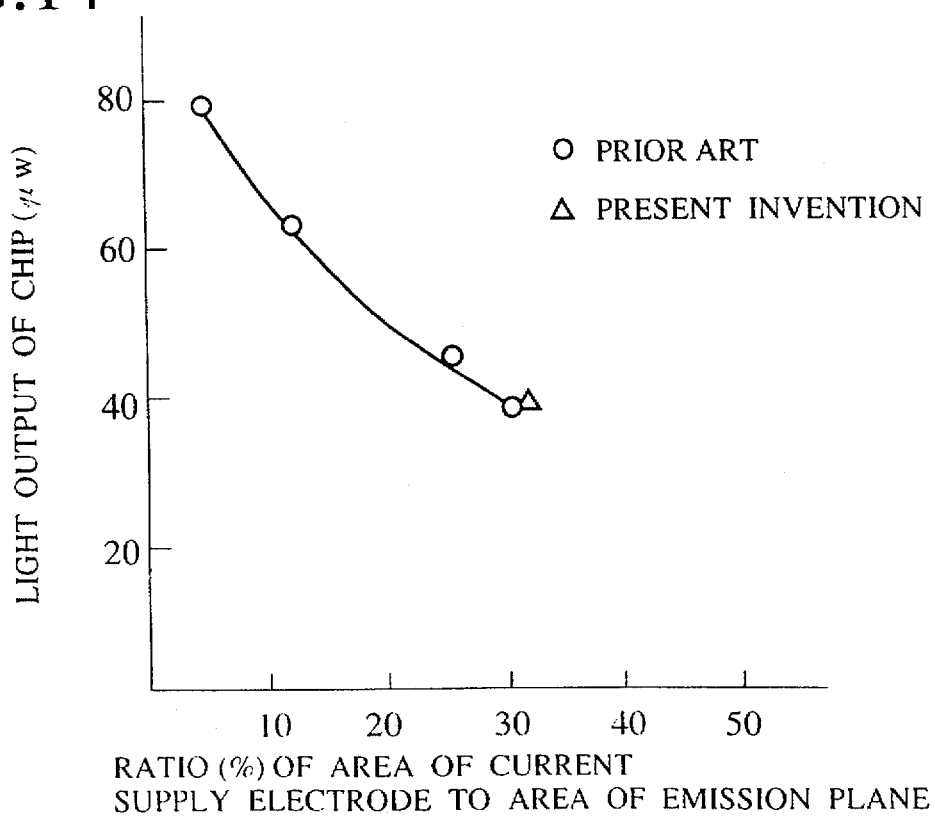
FIG. 14 is a graph showing the relationship between light output and the area of a current supply electrode.

FIG. 14 is a graph showing a change in the light output of a light emitting device with respect to a change in the width or area of a current supply electrode of the device. When the ratio of the area of the current supply electrode exceeds 25% of the area of the light emission plane of the device, the current supply electrode greatly absorbs emitted light, and therefore, the light output of the device decreases to the level of the prior art that has no current-blocking layer.

Figure 6:
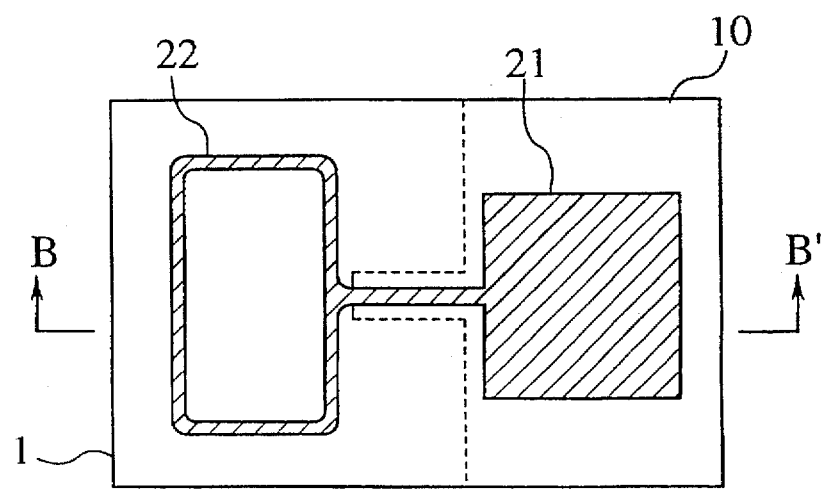
FIG. 6 is a plan view showing a semiconductor light emitting device according to a second embodiment of the present invention.

FIG. 6 is a plan view showing a semiconductor light emitting device according to the second embodiment of the present invention.

Figure 7:
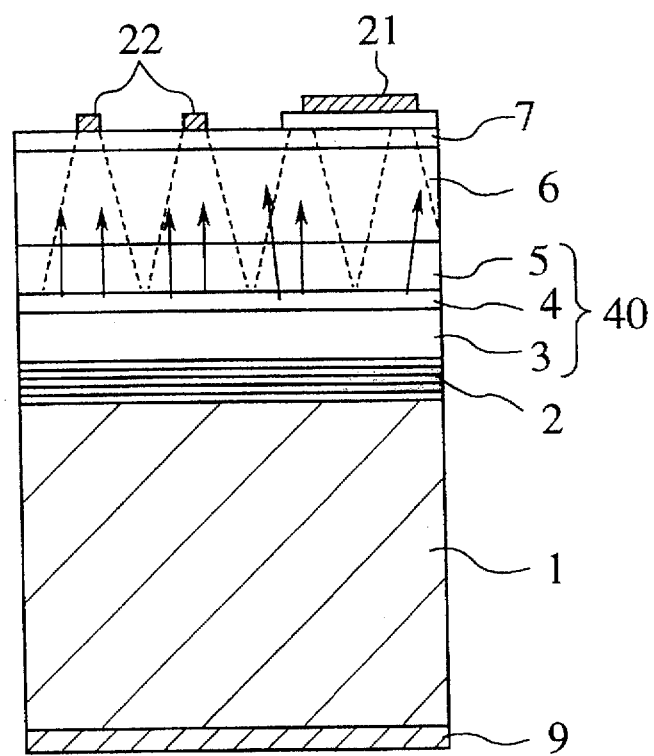
FIG. 7 is a sectional view taken along a line B—B' of FIG. 6.

A semiconductor substrate 1 is a GaAs compound semiconductor substrate. FIG. 7 is a sectional view taken along a line B—B' of FIG. 6. In FIG. 7, dotted lines indicate current flows. According to the first embodiment of FIG. 1, the bonding pad 21 is positioned at the center of the square chip, and therefore, the bonding pad 21 may more or less absorb emitted light.

To decrease the light absorption of the bonding pad, the second embodiment forms a current blocking layer 10 in a right area on the device and a bonding pad 21 on the current blocking layer 10. A left area on the device serves as a light emission plane and has a current supply electrode 22. In this way, the second embodiment separates the bonding pad 21 from the emission plane, thereby preventing a current from flowing under the bonding pad 21 and improving the light emission efficiency of the device.

FIGS. 8 to 12 are plan views showing semiconductor light emitting devices according to the third to seventh embodiments of the present invention, respectively.

Figure 8:
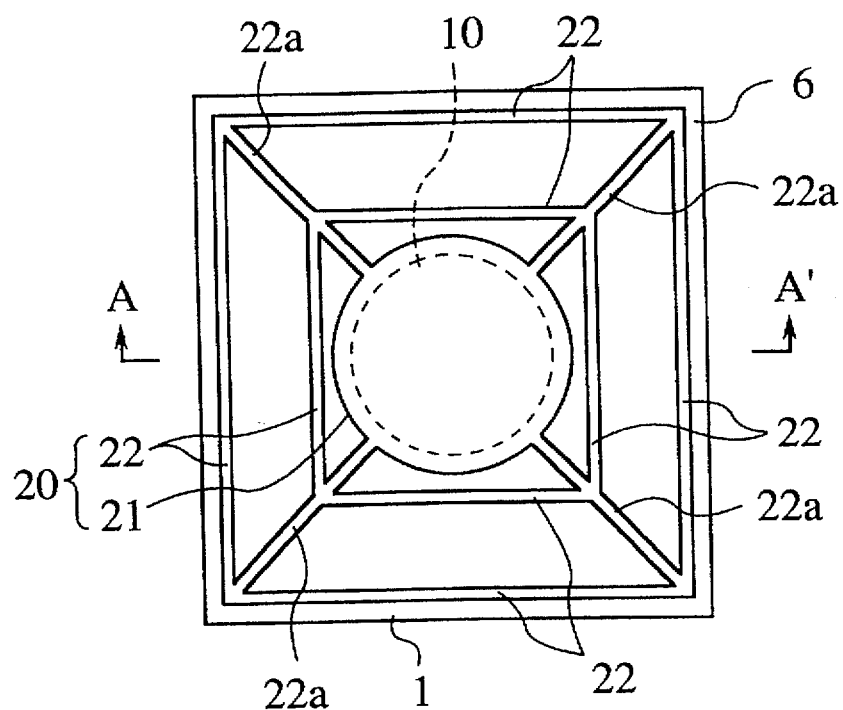
FIG. 8 is a plan view showing a semiconductor light emitting device according to a third embodiment of the present invention.

The third embodiment of FIG. 8 differs from the first embodiment of FIG. 1 in that a current supply electrode 22 has two quadrangle thin frames to avoid a current from concentrating under a bonding pad 21 and improve the light emission efficiency of the device.

Figure 9:
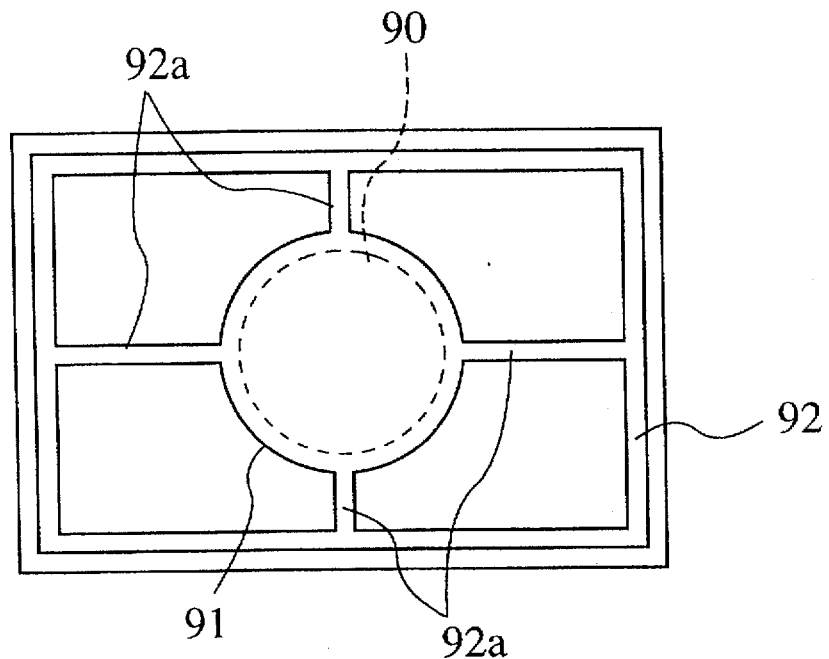
FIG. 9 is a plan view showing a semiconductor light emitting device according to a fourth embodiment of the present invention.

According to the fourth embodiment of FIG. 9, a current supply electrode 92 is formed along the periphery of a contact layer 7. This device has a current blocking layer 90 and a bonding pad 91, to prevent a current from concentrating under the bonding pad 91 and improve the light emission efficiency of the device.

Figure 10:
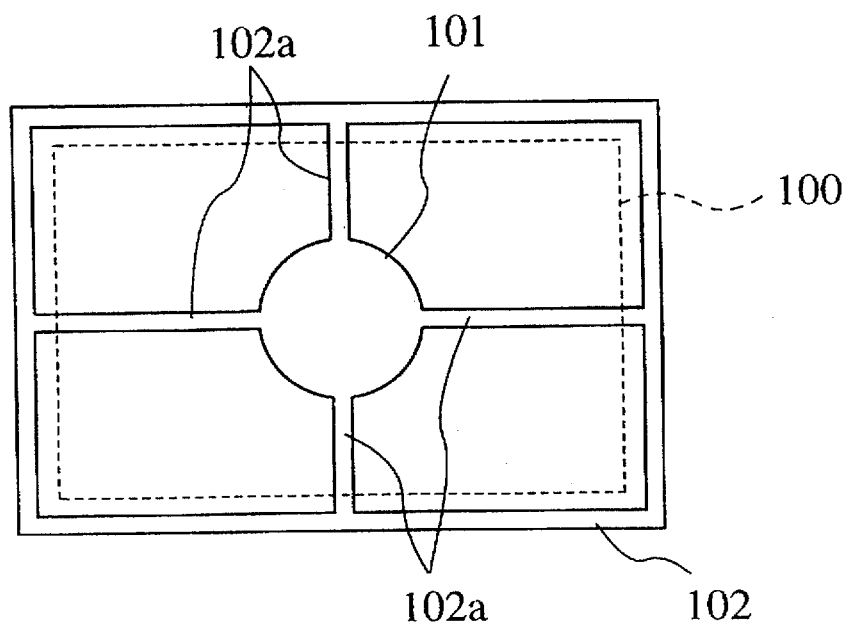
FIG. 10 is a plan view showing a semiconductor light emitting device according to a fifth embodiment of the present invention.

According to the fifth embodiment of FIG. 10, a current supply electrode 102 is formed along the periphery of a contact layer 7. This device has a current blocking layer 100 and a bonding pad 101. The current blocking layer 100 is formed all over the contact layer 7, to prevent a current from concentrating under the bonding pad 101 and improve the light emission efficiency of the device.

Figure 11:
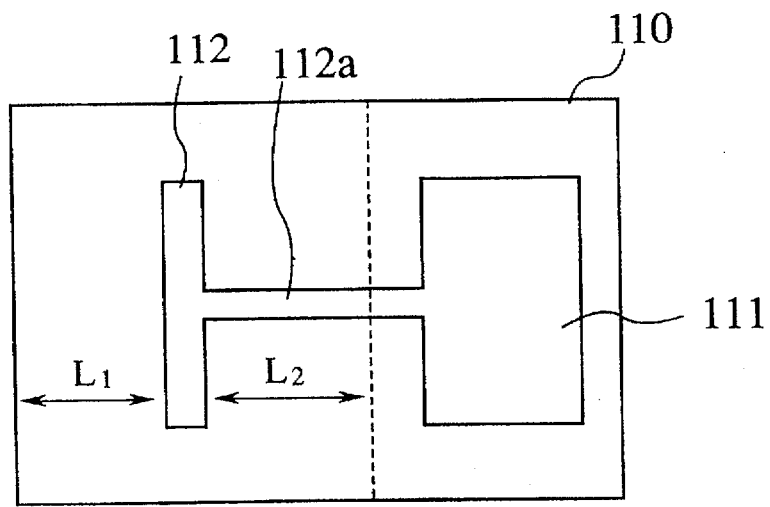
FIG. 11 is a plan view showing a semiconductor light emitting device according to a sixth embodiment of the present invention.

According to the sixth embodiment of FIG. 11, current supply electrodes 112 and 112a form a T shape. This device has a bonding pad 111 and a current block layer 110. The current supply electrodes 112 and 112a are positioned such that a distance L1 from the periphery of a contact layer 7 to the electrode 112 is substantially equal to a distance L2 from the current blocking layer 110 to the electrode 112. This embodiment prevents a current from concentrating under the bonding pad 111 and improves the light emission efficiency of the device.

Figure 12:
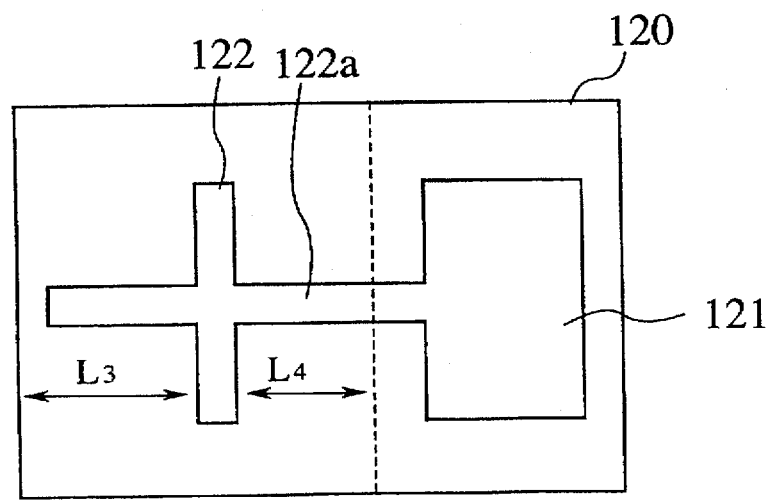
FIG. 12 is a plan view showing a semiconductor light emitting device according to a seventh embodiment of the present invention.
Figure 13:
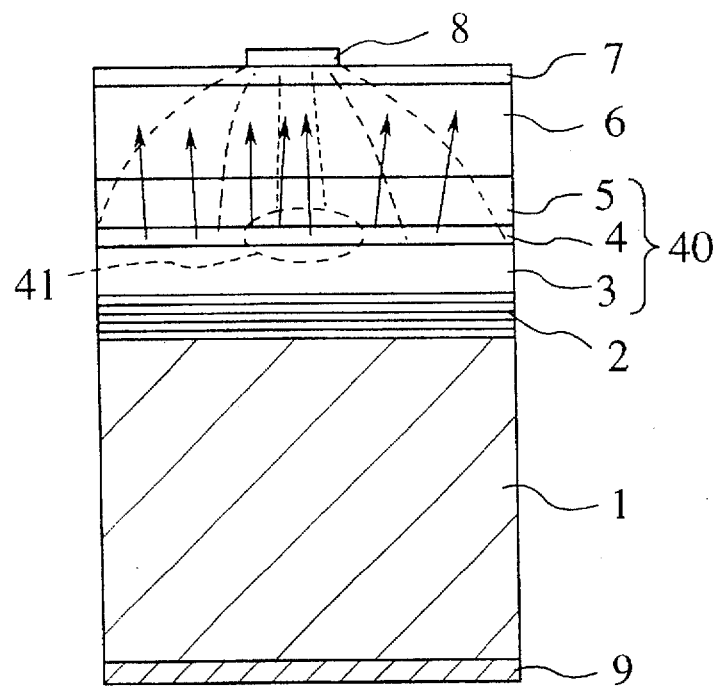
FIG. 13 is a sectional view showing a semiconductor light emitting device according to a prior art.

According to the seventh embodiment of FIG. 12, current supply electrodes 122 and 122a form a cross shape. The device has a bonding pad 121 and a current blocking layer 120. The current supply electrodes 122 and 122a are positioned such that a distance L3 from the periphery of a contact layer 7 to the current supply electrode 122 is substantially equal to a distance L4 from the current block layer 120 to the electrode 122. This embodiment prevents a current from concentrating under the bonding pad 121 and improves the light emission efficiency of the device.

The semiconductor light emitting device of the present invention may be formed on a GaAs substrate having a plane inclined with respect to a plane [100], or one having a plane [111], or one having a plane [311]. The device may be formed on a p-type GaAs substrate with semiconductor layers formed on the substrate having corresponding conduction type.

The current blocking layer 10 may be an insulation layer made of $SiO_2$ or $SiN_x$. In this case, the current diffusion layer 6 may be made of material other than GaAlAs-based material, if the material is sufficiently transparent with respect to the wavelength of emitted light. To deposit the material, the MBE may be used instead of the MOCVD.

Any one of the semiconductor light emitting devices of the present invention provides light output 1.5 to 1.8 times stronger than that of the prior art.

If the conduction type of a light emission plane is opposite to that of a current blocking layer in a light emitting device, a single process will grow layers up to the current blocking layer, to thereby simplify the manufacturing of the device.

In summary, the present invention provides a semiconductor light emitting device having a current blocking layer formed under a bonding pad. The current blocking layer prevents a current from flowing under the bonding pad. Unlike the prior art that collects a current under an excitation electrode, the present invention spreads a current from under the excitation electrode, improves the light emission efficiency of the device, and increases the brightness of the device. If the bonding pad is positioned close to any one of the four corners of a light emission plane, the light emission efficiency of the device will further improve.

What is claimed is:

1. A semiconductor light emitting device comprising:

a semiconductor substrate;

an emission layer formed on a first principal plane of said semiconductor substrate and having a plurality of semiconductor films;

a current blocking layer formed in a predetermined region on said emission layer;

an excitation electrode formed on said emission layer and current blocking layer; and a substrate electrode formed on a second principal plane of said semiconductor substrate, said excitation electrode having a bonding pad for connection to a bonding wire that passes an external current, and a current supply electrode, said current blocking layer being under the bonding pad, wherein said current supply electrode extends along the periphery of said semiconductor substrate and said bonding pad is located inside of said current supply electrode with a light emission surface between said current supply electrode and said bonding pad through which light is passed.

2. The device as claimed in claim 1, further comprising a reflection layer formed between the first principal plane of said semiconductor substrate and said emission layer.

3. The device as claimed in claim 2, further comprising a current diffusion layer formed on said emission layer.

4. The device as claimed in claim 3, further comprising a contact layer formed between one of said emission layer and current diffusion layer and said excitation electrode and current blocking layer.

5. The device as claimed in claim 4, wherein the top surface of the device except the bonding pad serves as an emission plane, and the ratio of the area of the current supply electrode to the area of the emission plane is equal to or smaller than 25%.

6. The device as claimed in claim 5, wherein the current supply electrode consists of quadrangle frames that surround the bonding pad and are electrically connected to the bonding pad.

7. The device as claimed in claim 5, wherein the current supply electrode consists of a quadrangle frame extending along the periphery of the contact layer.

8. The device as claimed in claim 2, wherein said current blocking layer is formed entirely on said contact layer except under the current supply electrode.

9. A semiconductor light emitting device comprising:

a semiconductor substrate;

an emission layer formed on a first principal plane of said semiconductor substrate and having a plurality of semiconductor films;

a current blocking layer formed in a predetermined region on said emission layer;

an excitation electrode formed on said emission layer; and a substrate electrode formed on a second principal plane of said semiconductor substrate, said excitation electrode having a bonding pad for connection to a bonding wire that passes an external current, and a current supply electrode strip, said current blocking layer being under the bonding pad;

wherein said current supply electrode strip extends along the periphery of said semiconductor substrate with a light passing surface through which light is passed inside of said current supply electrode strip, and said bonding pad is located outside of said current supply electrode and said light passing surface.

10. A semiconductor light emitting device comprising:

a semiconductor substrate;

an emission layer formed on a first principal plane of said semiconductor substrate and having a plurality of semiconductor films;

a current blocking layer formed in a predetermined region on said emission layer;

an excitation electrode formed on said emission layer and current blocking layer; and a substrate electrode formed on a second principal plane of said semiconductor substrate, said excitation electrode having a bonding pad for connection to a bonding wire that passes an external current, and a current supply electrode, said current blocking layer being under the bonding pad;

wherein said current blocking layer is formed in one area on the contact layer, and the emission plane is formed in another area on the contact layer.

11. A semiconductor light emitting device comprising:

a semiconductor substrate;

an emission layer formed on a first principal plane of said semiconductor substrate and having a plurality of semiconductor films;

a current blocking layer formed in a predetermined region on said emission layer;

an excitation electrode formed on said emission layer and current blocking layer; and a substrate electrode formed on a second principal plane of said semiconductor substrate, said excitation electrode having a bonding pad for connection to a bonding wire that passes an external current, and a current supply electrode, said current blocking layer being under the bonding pad;

wherein said current blocking layer is formed in one area on the contact layer, and the emission plane is formed in another area on the contact layer; and wherein said current blocking layer has a thickness equal to or greater than 0.1 μm.

12. A semiconductor light emitting device comprising:

a semiconductor substrate;

an emission layer formed on a first principal plane of said semiconductor substrate and having a plurality of semiconductor films;

a current blocking layer formed in a predetermined region on said emission layer;

an excitation electrode formed on said emission layer and current blocking layer; and a substrate electrode formed on a second principal plane of said semiconductor substrate, said excitation electrode having a bonding pad for connection to a bonding wire that passes an external current, and a current supply electrode, said current blocking layer being under the bonding pad;

wherein said current blocking layer is formed in one area on the contact layer, and the emission plane is formed in another area on the contact layer; and wherein the current supply electrode includes a quadrangle frame.

13. A semiconductor light emitting device comprising:

a semiconductor substrate;

an emission layer formed on a first principal plane of said semiconductor substrate and having a plurality of semiconductor films;

a current blocking layer formed in a predetermined region on said emission layer;

an excitation electrode formed on said emission layer and current blocking layer; and a substrate electrode formed on a second principal plane of said semiconductor substrate, said excitation electrode having a bonding pad for connection to a bonding wire that passes an external current, and a current supply electrode, said current blocking layer being under the bonding pad;

wherein said current blocking layer is formed in one area on the contact layer, and the emission plane is formed in another area on the contact layer; and wherein the current supply electrode has a T shape.

14. A semiconductor light emitting device comprising:

a semiconductor substrate;

an emission layer formed on a first principal plane of said semiconductor substrate and having a plurality of semiconductor films;

a current blocking layer formed in a predetermined region on said emission layer;

an excitation electrode formed on said emission layer and current blocking layer; and a substrate electrode formed on a second principal plane of said semiconductor substrate, said excitation electrode having a bonding pad for connection to a bonding wire that passes an external current, and a current supply electrode, said current blocking layer being under the bonding pad;

wherein said current blocking layer is formed in one area on the contact layer, and the emission plane is formed in another area on the contact layer; and wherein the current supply electrode has a cross shape.

15. A semiconductor light emitting device comprising:

a semiconductor substrate;

an emission layer formed on a first principal plane of said semiconductor substrate and having a plurality of semiconductor films;

a current blocking layer formed in a predetermined region on said emission layer;

an excitation electrode formed on said emission layer and current blocking layer; and a substrate electrode formed on a second principal plane of said semiconductor substrate, said excitation electrode having a bonding pad for connection to a bonding wire that passes an external current, and a current supply electrode, said current blocking layer being under the bonding pad;

wherein said current blocking layer is formed in one area on the contact layer, and the emission plane is formed in another area on the contact layer;

wherein the current supply electrode has a cross shape; and wherein said semiconductor substrate is a GaAs compound semiconductor substrate, and said emission layer is made of a four-element compound semiconductor containing In, Ga, Al, and P.

* * * * *

UNITED STATES PATENT AND TRADEMARK OFFICE
CERTIFICATE OF CORRECTION

PATENT NO. : 5,744,828
DATED : April 28, 1998
INVENTOR(S) : Hideki NOZAKI et al.

It is certified that error appears in the above-identified patent and that said Letters Patent is hereby corrected as shown below:

Claim 1, Column 7, line 47, "pad," should read --pad;--.

Signed and Sealed this

Ninth Day of March, 1999

Attest:

Q. TODD DICKINSON

*Attesting Officer*     *Acting Commissioner of Patents and Trademarks*